United States Patent
Hara

[11] Patent Number: 6,090,667
[45] Date of Patent: Jul. 18, 2000

[54] METHOD OF MANUFACTURING FLOATING GATE TYPE TRANSISTOR

[75] Inventor: Hideki Hara, Tokyo, Japan

[73] Assignee: NEC Corporation, Tokyo, Japan

[21] Appl. No.: 09/190,205

[22] Filed: Nov. 13, 1998

Related U.S. Application Data

[62] Division of application No. 08/975,185, Nov. 20, 1997, Pat. No. 5,977,593.

[30] Foreign Application Priority Data

Nov. 28, 1996 [JP] Japan .................................. 8-317595

[51] Int. Cl.$^7$ .............................................. H01L 21/8247
[52] U.S. Cl. ........................................... 438/258; 438/675
[58] Field of Search ................................... 438/211, 257, 438/258, 586, 593, 594, 597, 629, 672, 675

[56] References Cited

U.S. PATENT DOCUMENTS

| | | | |
|---|---|---|---|
| 4,543,597 | 9/1985 | Shibata | 257/355 |
| 4,780,431 | 10/1988 | Maggioni et al. | 438/258 |
| 5,188,976 | 2/1993 | Kume et al. | 438/258 |
| 5,605,853 | 2/1997 | Yoo et al. | 438/258 |
| 5,760,429 | 9/1998 | Yano et al. | 257/211 |

FOREIGN PATENT DOCUMENTS

7244991  9/1995  Japan .

*Primary Examiner*—Chandra Chaudhari
*Attorney, Agent, or Firm*—Sughrue, Mion, Zinn, Macpeak & Seas, PLLC

[57] ABSTRACT

A semiconductor device includes a field oxide film, a plurality of word lines, an insulating interlayer film, a plurality of contact holes, a plurality of protective diffusion layers, a plurality of common contact holes, and a plurality of metal plugs. The field oxide film is formed on a silicon substrate having one conductivity type. The word lines are formed by patterning on the field oxide film. The insulating interlayer film is formed on the field oxide film to cover the word lines. The contact holes are formed in the field oxide film to be self-aligned with the word lines. The protective diffusion layers have an opposite conductivity type and are formed on a surface of the semiconductor substrate to correspond to the contact holes. The common contact holes are formed in the insulating interlayer film to extend across the word lines and the protective diffusion layers. The common contact holes are formed at a depth to reach the protective diffusion layers while partly exposing the word lines. The metal plugs fill the common contact holes to electrically connect the protective diffusion layers and the word lines with each other. A method of manufacturing a semiconductor device is also disclosed.

5 Claims, 6 Drawing Sheets

METHOD OF MANUFACTURING FLOATING GATE TYPE TRANSISTOR

This is a divisional of application Ser. No. 08/975,185, now U.S. Pat. No. 5,977,593, filed Nov. 20, 1997, the disclosure of which is incorporated herein by reference.

BACKGROUND OF THE INVENTION

The present invention relates to a semiconductor device and a method of manufacturing the same and, more particularly, to a connection structure for a charge protective layer for an electrode on a gate insulating film and an upper wiring layer, and a method of manufacturing the same.

Current semiconductor memory devices are roughly classified into volatile memories represented by a DRAM (Dynamic Random Access Memory) or SRAM (Static Random Access Memory), and nonvolatile memories represented by a flash EEPROM (Electrically Erasable and Programmable Read Only Memory).

As a semiconductor element constituting the former, a CMOS (Complementary Metal-Oxide Semiconductor) transistor is mainly used. As a semiconductor element constituting the latter, a floating gate type transistor is used. In the floating gate type transistor, source and drain regions are formed on the semiconductor surface, and a channel region is formed between the source and drain regions. The first gate insulating film, a floating gate electrode, the second gate insulating film, and a control gate electrode are sequentially formed on the channel region to constitute the so-called floating gate type transistor.

In the manufacture of such a floating gate type transistor, the first-layer gate electrode serving as the floating gate electrode is formed on a silicon oxide film on the major surface of the semiconductor substrate, an insulating interlayer film as a composite film of the silicon oxide film and a silicon nitride film is formed on the first-layer gate electrode, and the second-layer gate electrode serving as the control gate electrode is formed on the insulating interlayer film.

In this structure, nonvolatile storage information charges are accumulated in the floating gate electrode serving as the first-layer gate electrode. The information charges are written and erased by injecting electrons from the semiconductor substrate into the floating gate electrode and discharging electrons from the floating gate electrode to the semiconductor substrate, respectively.

In the manufacturing process of a flash memory constituted by a floating gate type transistor, the floating gate type transistor is exposed to a plasma atmosphere depending on the process. For example, in the dry etching process of a wiring layer, the insulating interlayer film where the wiring layer is formed or the word lines of the flash memory are charged in the plasma atmosphere. The word lines are formed by connecting a predetermined number of control gate electrodes of the floating gate type transistors constituting the nonvolatile memory elements of the memory cell portion.

When the word line is negatively charged, a large amount of holes are injected from the semiconductor substrate into the floating gate electrode. This causes dielectric breakdown of the first gate insulating film under the floating gate electrode. Alternatively, the floating gate electrode is positively charged to vary the threshold of the memory cell, and accordingly the threshold distribution of the flash memories after the manufacturing process widens largely. In this case, when shipping the flash memories, the threshold voltages must be uniformed in the inspecting process.

In order to solve these problems, conventionally, a charge prevention protective diode element is connected to the word line. This technique is described in, e.g., Japanese Patent Laid-Open No. 7-244991. A structure in which an electrode on a gate insulating film is connected to a diffusion layer, i.e., a protective diode, in this manner is similarly found in a semiconductor device constituted by a MOS transistor.

Figure 5A:
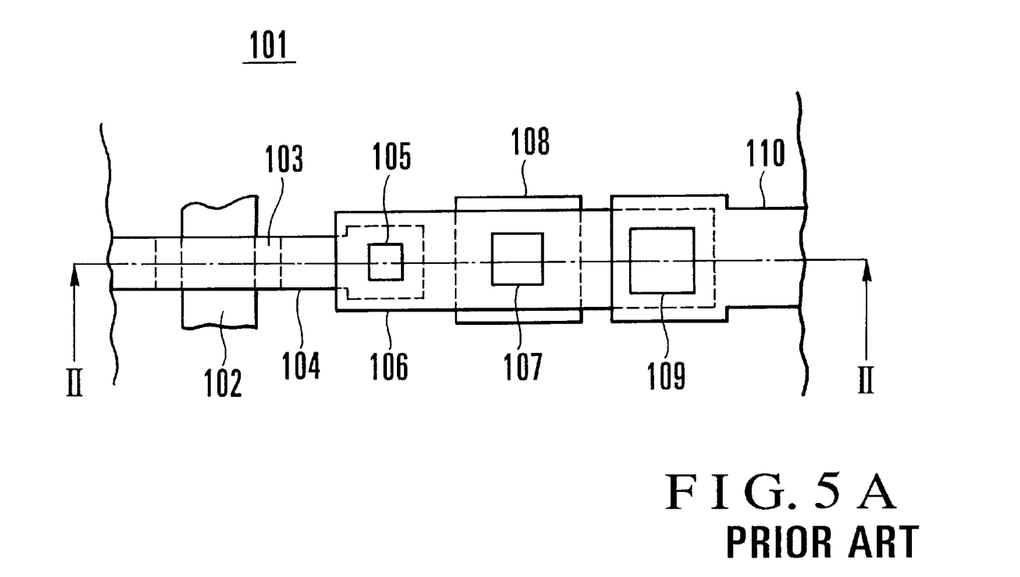
FIG. 5A is a plan view of the charge preventive region of a conventional flash memory.
Figure 5B:
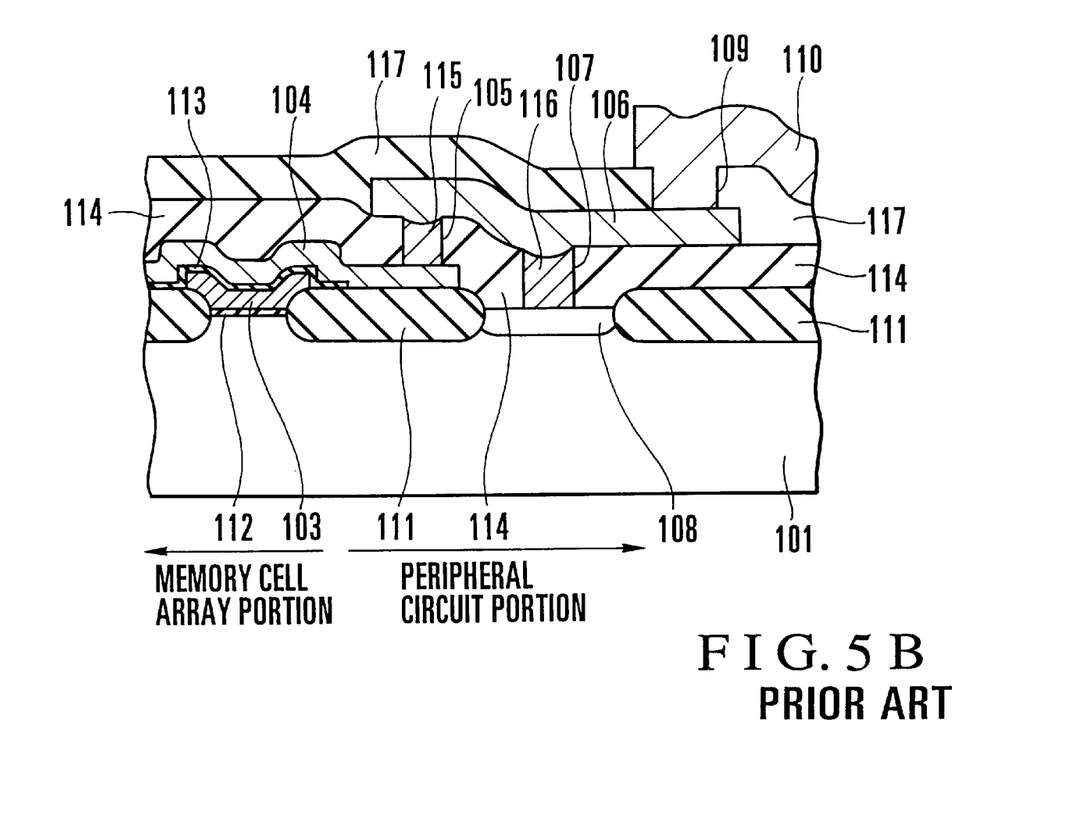
FIG. 5B is a sectional view taken along the line II—II of FIG. 5A.

The technique described in the precedent reference described above will be described as the prior art with reference to FIGS. 5A and 5B. FIG. 5A shows a flash memory in which an insulating interlayer film shown in FIG. 5B is omitted. Referring to FIG. 5A, a source/drain diffusion layer 102 is formed on a silicon substrate 101. A floating gate electrode 103 is formed, and furthermore a word line 104, i.e., a control gate electrode, is formed. In this manner, a plurality of memory cells constituted by floating gate type transistors are formed in the memory cell array portion.

The word line 104 disposed in the memory cell array portion is electrically connected to a first aluminum wiring layer 106 through a contact hole 105. The first aluminum wiring layer 106 is electrically connected to a protective diffusion layer 108 through a contact hole 107. The diffusion junction of the protective diffusion layer 108 and silicon substrate 101 constitutes the protective diode element described above. The first aluminum wiring layer 106 is connected to a second aluminum wiring layer 110 through a through hole 109. The second aluminum wiring layer 110 is connected to a peripheral circuit portion.

In this manner, the word lines disposed in the memory cell array portion are respectively connected to the protective diode elements and to the peripheral circuit portion.

The sectional structure of this region will be described with reference to FIG. 5B. Referring to FIG. 5B, a field oxide film 111 is selectively formed on the surface of the silicon substrate 101 having a p-type conductivity. The floating gate electrode 103 is formed on the silicon substrate 101 through a gate insulating film 112. The word line 104 is formed to cover a gate insulating film 113 formed on the surface of the floating gate electrode 103. Furthermore, the protective diffusion layer 108 having an n-type conductivity is formed at a predetermined region on the surface of the silicon substrate 101. This p-n junction constitutes the protective diode element described above.

An insulating interlayer film 114 covering the entire surface of the structure is formed, and the contact hole 105 reaching the word line 104 and the contact hole 107 reaching the protective diffusion layer 108 are formed in the insulating interlayer film 114. The contact holes 105 and 107 are filled with metal plugs 115 and 116, respectively. The metal plugs 115 and 116 are connected to the first aluminum wiring layer 106 formed on the insulating interlayer film 114.

An insulating interlayer film 117 covering the first aluminum wiring layer 106 is formed, and the through hole 109 reaching the first aluminum wiring layer 106 is formed in the insulating interlayer film 117. The second aluminum wiring layer 110 is connected to the first aluminum wiring layer 106 through the through hole 109.

In the prior art described above, the following two major problems arise. The first problem is that, when the protective diode element for charge prevention of the control gate electrode, i.e., of the word line 104, is formed, the area of the protective diffusion layer 108 described above increases. If the protective diffusion layers 108 are formed in units of word lines 104, the area of the resultant semiconductor chip undesirably increases.

Usually, as the size of the contact holes 105 and 107 decreases, the contact holes 105 and 107 must indispensably be filled with the metal plugs 115 and 116. The metal plugs 115 and 116 are formed through deposition and dry etching, i.e., etch back, of a refractory metal. The second problem is that, in this etch back process, the word line 104 is charged with plasma ions or electrons of the dry etching gas to cause dielectric breakdown.

In general, at a certain stage of the manufacturing process of a semiconductor device or a MOS transistor, the gate electrode of the MOS transistor, e.g., the word line of the semiconductor device, is insulated by an insulating film, e.g., a field oxide film, a gate insulating film, or an insulating interlayer film, and is set in a floating state. This eliminates the discharge path for the charges accumulated when the gate electrode is exposed to the plasma as described above and charged. Such plasma charging of the word line or the like causes dielectric breakdown of the gate insulating film, leading to a decrease in the manufacturing yield of the semiconductor device.

SUMMARY OF THE INVENTION

It is an object of the present invention to provide a method of manufacturing a high-density, high-yield semiconductor device in which charges of the word line due to a plasma are removed in a simple manner.

In order to achieve the above object, according to the present invention, there is provided a semiconductor device comprising a first insulating film formed on a semiconductor substrate having one conductivity type, a plurality of electrodes formed by patterning on the first insulating film, a second insulating film formed on the first insulating film to cover the electrodes, a plurality of opening portions formed in the first insulating film to be self-aligned with the electrodes, a plurality of first diffusion layers having an opposite conductivity type and formed on a surface of the semiconductor surface to correspond to the opening portions, a plurality of common contact holes formed in the second insulating film to extend across the electrodes and the first diffusion layers, the common contact holes being formed at a depth to reach the first diffusion layers while partly exposing the electrodes, and a plurality of metal plugs that fill the common contact holes to electrically connect the first diffusion layers and the electrodes with each other.

DESCRIPTION OF THE PREFERRED EMBODIMENTS

The present invention will be described in detail with reference to the accompanying drawings.

Figure 1:
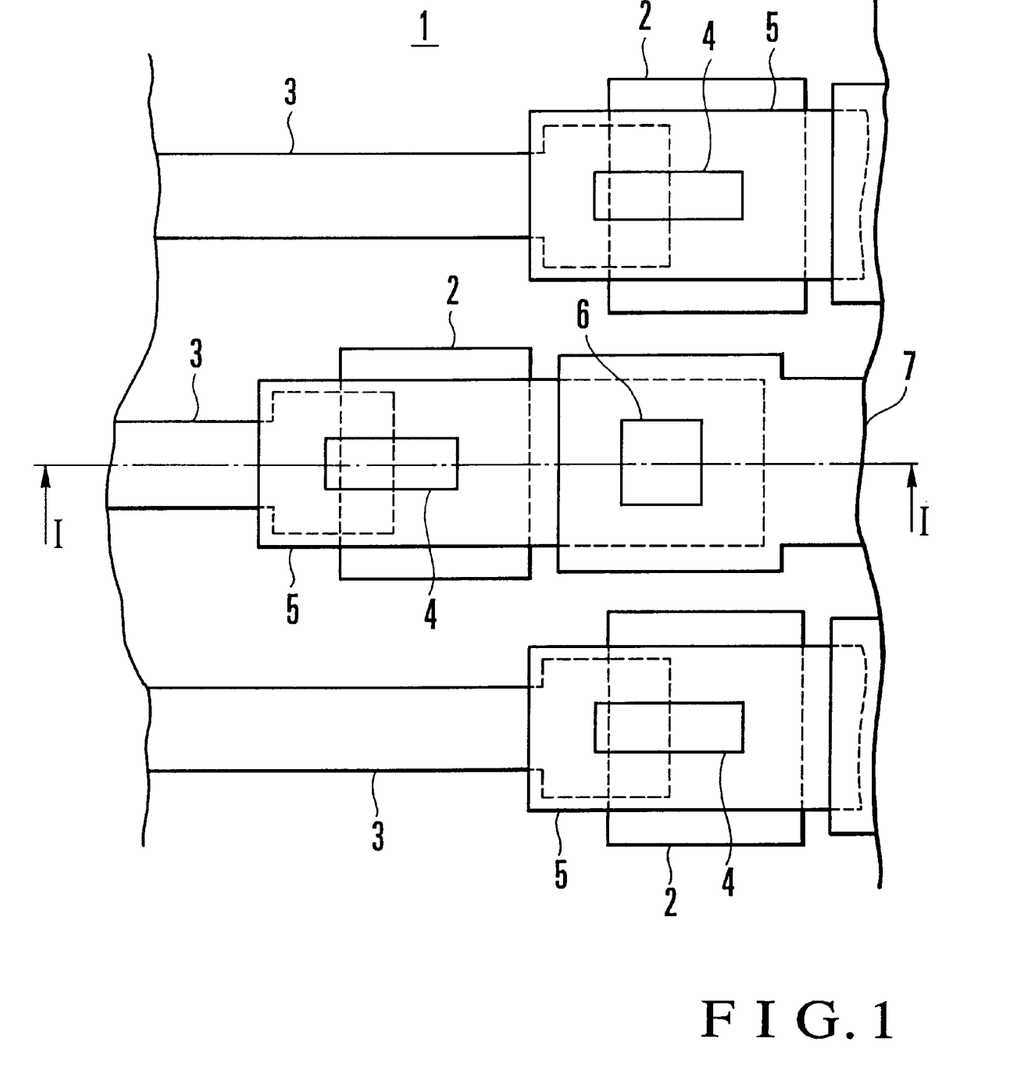
FIG. 1 is a plan view of the charge preventive region of a flash memory according to the first embodiment of the present invention.

FIG. 1 shows a flash memory according to the first embodiment of the present invention, in which the charge preventive region of the word line and the insulating interlayer film are omitted. Referring to FIG. 1, a plurality of protective diffusion layers 2 are formed in a predetermined region on a silicon substrate 1. A plurality of word lines 3 extending from a memory cell array portion are arranged on the silicon substrate 1 through a field oxide film to be parallel to each other at a predetermined distance from each other. The word lines 3 are electrically connected to a first aluminum wiring layer 5 through common contact holes 4 and to the protective diffusion layers 2. The protective diffusion layers 2 are arranged at a predetermined distance from each other in a direction perpendicularly intersecting the word lines 3 to stagger with the adjacent word lines 3.

The first aluminum wiring layer 5 is electrically connected to a second aluminum wiring layer 7 through a through hole 6. The second aluminum wiring layer 7 is connected to a peripheral circuit portion.

Figure 2:
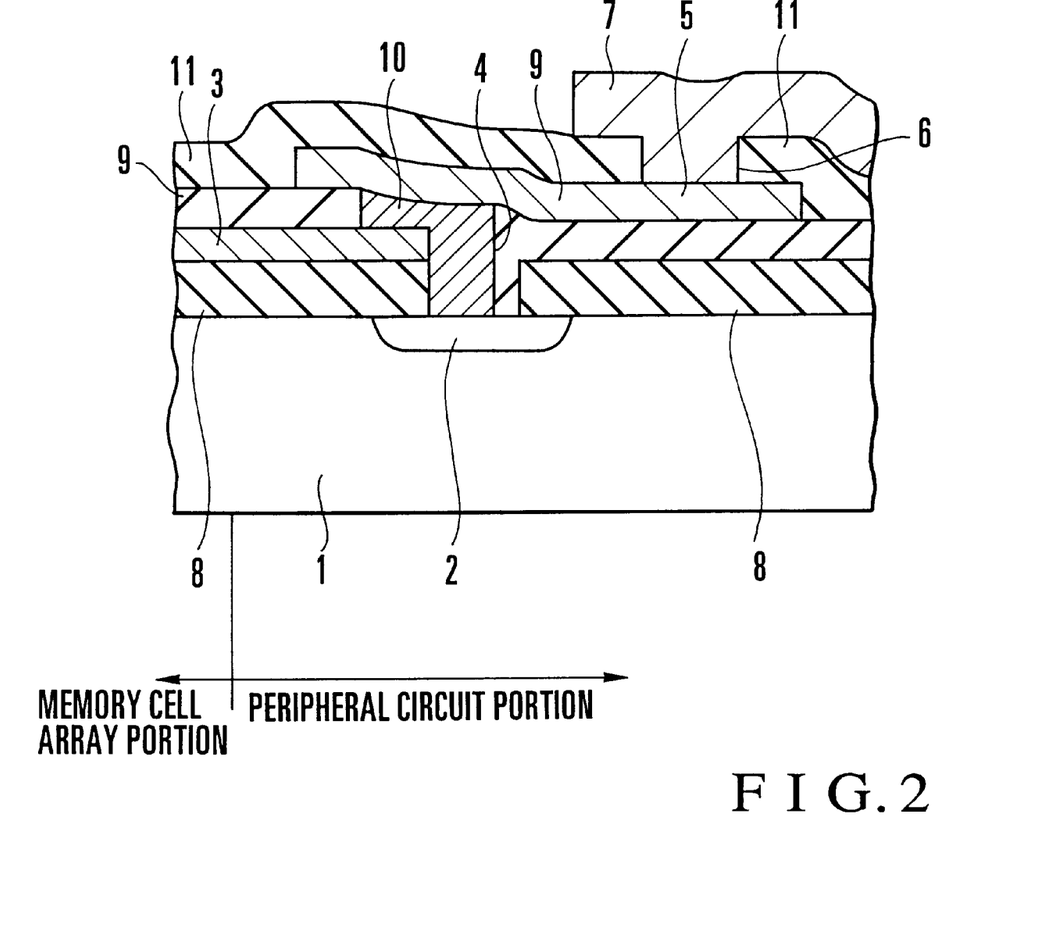
FIG. 2 is a sectional view taken along the line I—I of FIG. 1.

The sectional structure of this region will be described with reference to FIG. 2. Referring to FIG. 2, the protective diffusion layer 2 is formed in a predetermined region on the surface of the silicon substrate 1 having a p-type conductivity. The protective diffusion layer 2 has an n-type conductivity, and the p-n junction formed between the protective diffusion layer 2 and silicon substrate 1 constitutes a protective diode element. A field oxide film 8 is formed on the region of the silicon substrate 1 excluding the protective diffusion layer 2.

The word line 3 is formed on the field oxide film 8. An insulating interlayer film 9 covering the entire surface is formed on the word line 3 and field oxide film 8. The common contact hole 4 exposing the word line 3 and reaching the protective diffusion layer 2 is formed in the insulating interlayer film 9. The common contact hole 4 is filled with a metal plug 10. The metal plug 10 is electrically connected to the first aluminum wiring layer 5 selectively formed on the insulating interlayer film 9.

A second insulating interlayer film 11 covering the first aluminum wiring layer 5 is formed on the insulating interlayer film 9, and the through hole 6 reaching the first aluminum wiring layer 5 is formed in the second insulating interlayer film 11. The second aluminum wiring layer 7 is connected to the first aluminum wiring layer 5 through this through hole 6.

A method of manufacturing the semiconductor device shown in FIGS. 1 and 2 will be described with reference to FIGS. 3A to 3H.

Figure 3A:
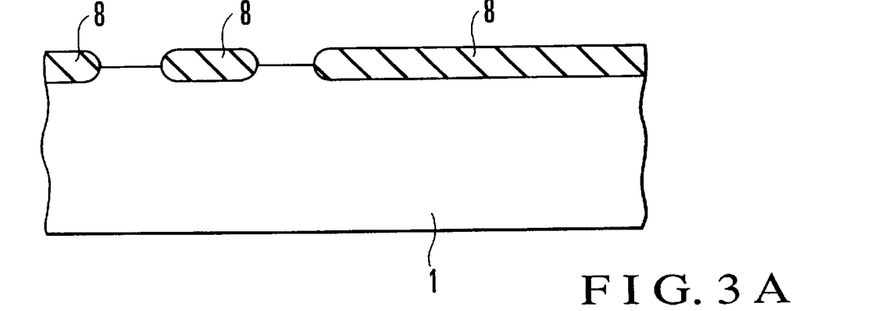
FIGS. 3A to 3H are sectional views showing the steps in manufacturing the flash memory shown in FIGS. 1 and 2.

As shown in FIG. 3A, the field oxide film 8 having a thickness of about 400 nm is formed in a predetermined region by selective thermal oxidation of the surface of the silicon substrate 1 having the p-type conductivity.

Figure 3B:
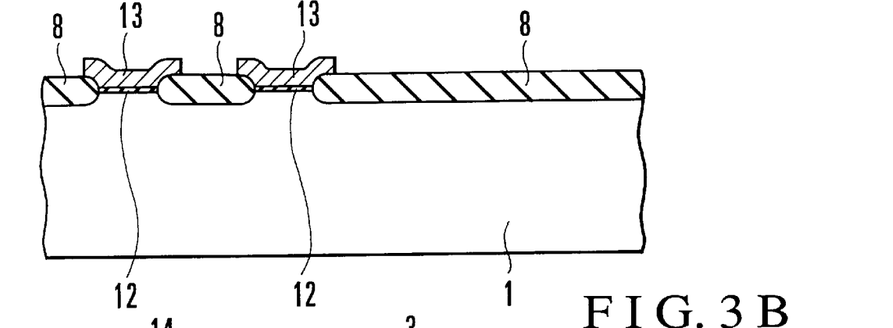

Subsequently, as shown in FIG. 3B, a gate insulating film 12 is formed on the silicon substrate 1 within the memory cell region. This gate insulating film 12 is a silicon oxide film having a thickness of about 10 nm. A floating gate electrode 13 is formed to cover the gate insulating film 12. The floating gate electrode 13 is a polysilicon film containing phosphorus as an impurity and having a thickness of about 300 nm.

Figure 3C:
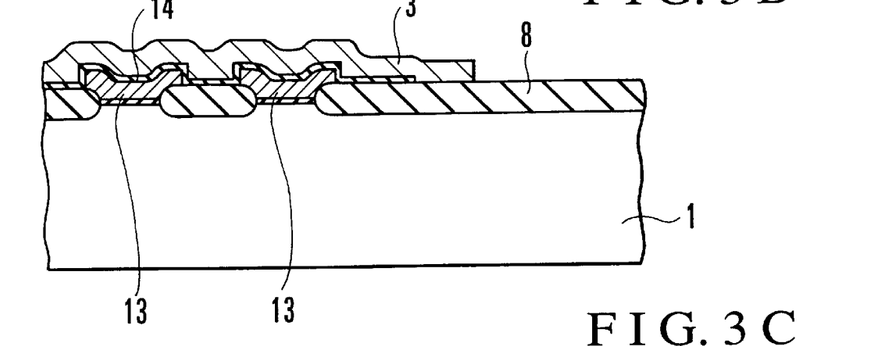

As shown in FIG. 3C, a gate insulating film 14 is formed on the floating gate electrode 13. The gate insulating film 14 comprises an insulating film consisting of a stacked silicon oxide film/silicon nitride film/silicon oxide film (ONO) structure. The gate insulating film 14 is set such that the converted thickness of the silicon oxide film becomes about 15 nm. The word line 3 is selectively formed on the field insulating film 8 to cover the gate insulating film 14. The word line 3 comprises a conductive film in which a polysilicon film containing phosphorus as the impurity and a tungsten silicide film are stacked.

Figure 3D:
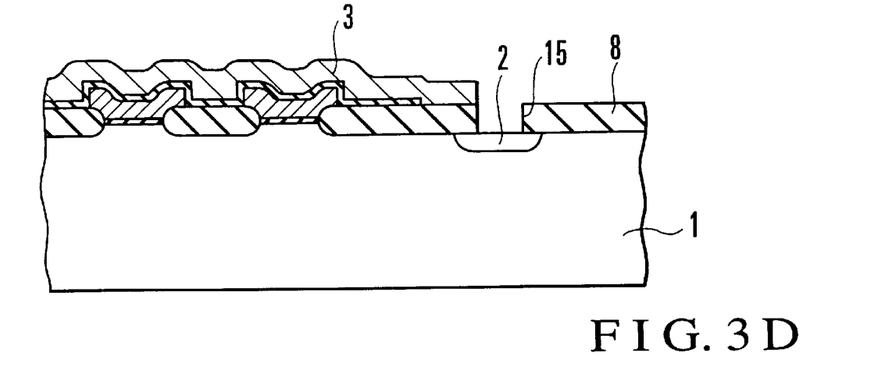

As shown in FIG. 3D, by using photolithography and dry etching, a contact hole 15 is formed in the field oxide film 8 to reach the silicon substrate 1. The contact hole 15 is self-aligned with the word line 3. Arsenic as an impurity is ion-implanted in the surface of the silicon substrate 1 through the contact hole 15, and thereafter the resultant structure is annealed to form the protective diffusion layer 2.

Figure 3E:
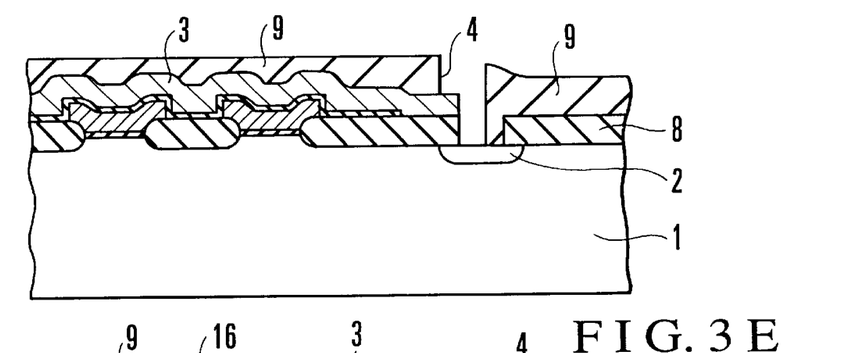

As shown in FIG. 3E, the insulating interlayer film 9 is formed on the word line 3 and field oxide film 8 to cover the entire surface. The insulating interlayer film 9 is a BPSG (Boro PhosphoSilicate Glass) film having a thickness of about 600 nm. The common contact hole 4 is formed in the insulating interlayer film 9 extending across the protective diffusion layer 2 and word line 3. The common contact hole 4 is formed to reach the protective diffusion layer 2 while partly exposing the word line 3.

Figure 3F:
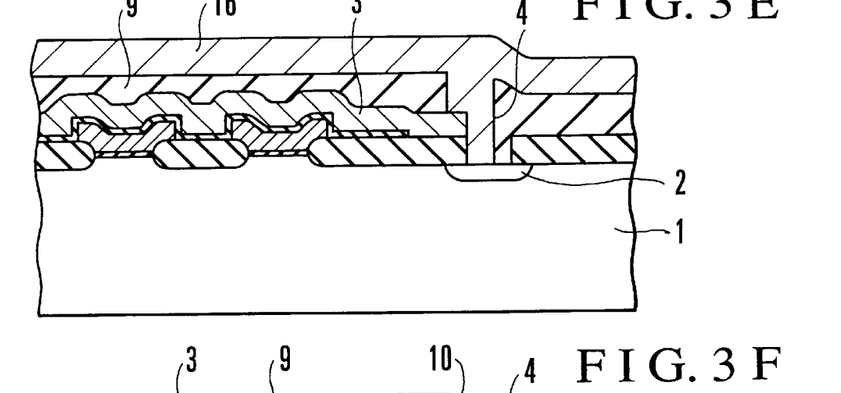

As shown in FIG. 3F, a metal film 16 that covers the insulating interlayer film 9 and fills the common contact hole 4 is formed. The metal film 16 is in contact with the word line 3 and protective diffusion layer 2 in the common contact hole 4. As the metal film 16, a tungsten film or the like deposited by CVD is used.

Figure 3G:
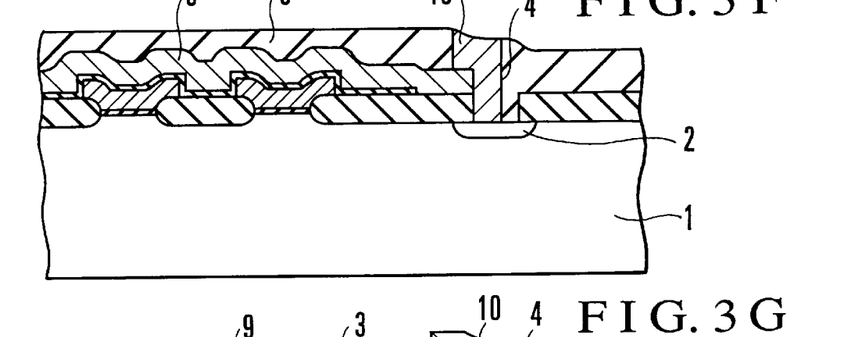

The metal film 16 is etched back by reactive ion etching using a plasma. This etch back removes the metal film 16 on the insulating interlayer film 9. As a result, the metal plug 10 is formed in the common contact hole 4, as shown in FIG. 3G. The metal plug 10 is electrically connected to the protective diffusion layer 2 and word line 3.

At this time, the word line 3 is charged with plasma ions or electrons during the etch back step. Since the word line 3 is connected to the protective diffusion layer 2 through the metal film 16, the charges of the word line 3 are discharged through the protective diffusion layer 2.

When the word line 3 is positively charged, positive charges are accumulated in the word line 3 in a predetermined amount or more. When the charge voltage of the word line 3 becomes equal to or higher than the breakdown voltage of the p-n junction formed by the protective diffusion layer 2 and silicon substrate 1, the p-n junction break downs to cause discharge. When the word line 3 is negatively charged, the p-n junction formed by the protective diffusion layer 2 and silicon substrate 1 forms a forward bias to facilitate discharge.

Figure 3H:
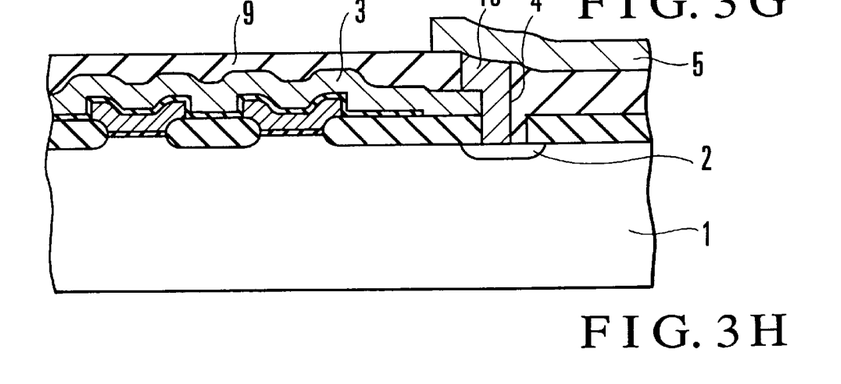

As shown in FIG. 3H, the first aluminum wiring layer 5 electrically connected to the metal plug 10 is formed.

The second insulating interlayer film 11 is formed on the insulating interlayer film 9 and first aluminum wiring layer 5. The through hole 6 is formed in the second insulating interlayer film 11 to reach the first aluminum wiring layer 5. The second aluminum wiring layer 7 is selectively formed on the second insulating interlayer film 11 to fill the through hole 6, thereby manufacturing the semiconductor device shown in FIG. 2. As a result, the word line 3 disposed in the memory cell array portion is connected to the peripheral circuit portion through the second aluminum wiring layer 7.

In the first embodiment described above, the adjacent protective diffusion layers 2 for the protective diode elements are formed to respectively self-aligned with the word lines 3, and are arranged in a direction perpendicularly intersecting the word lines 3 such that they stagger with the word lines 3. Accordingly, an increase in area of the semiconductor chip as in the prior art can be avoided.

The common contact hole 4 is formed to extend across the word line 3 and protective diffusion layer 2, and the metal plug 10 is formed in the common contact hole 4. Even if the metal plug 10 is formed by deposition and dry etching, i.e., etch back, of a refractory metal, the charges of the word lines 3 from the plasma in the etch back process are removed through the protective diffusion layer 2. As a result, dielectric breakdown occurring in the prior art is completely eliminated.

Figure 4:
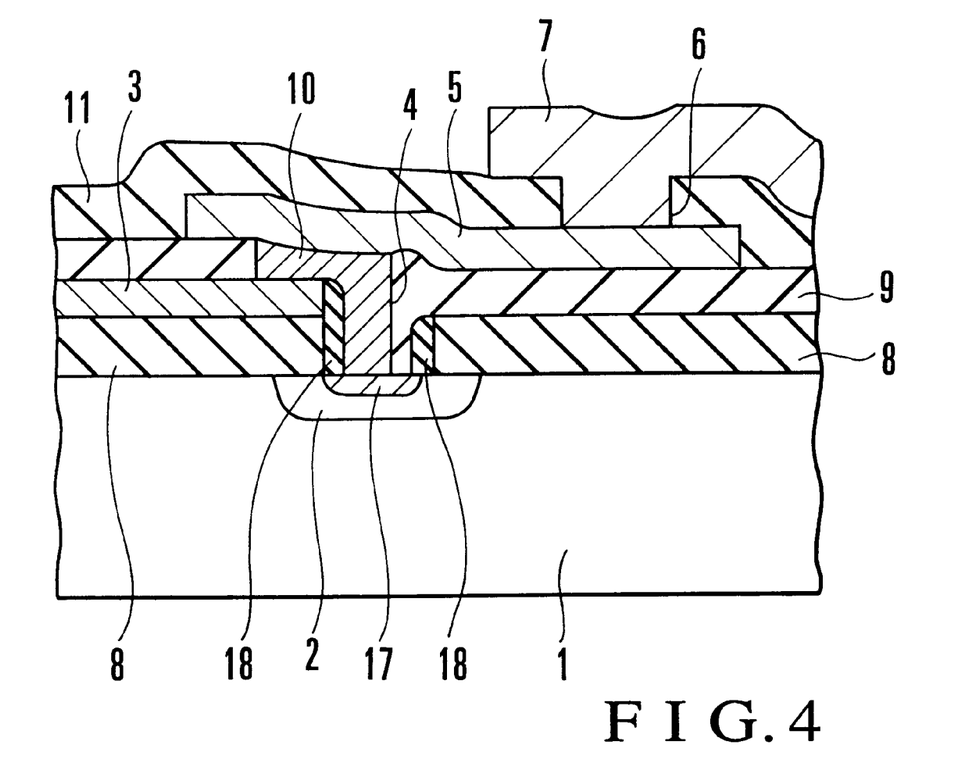
FIG. 4 is a sectional view of the charge preventive region of a flash memory according to the second embodiment of the present invention.

FIG. 4 shows the charge protective region of the word line of a flash memory according to the second embodiment of the present invention. Portions that are identical to those shown in FIG. 2 are denoted by the same reference numerals as in FIG. 2, and a description thereof will be omitted.

As shown in FIG. 4, a side-wall insulating film 18 is formed on the side wall of a field oxide film 8 and a word line 3. An insulating interlayer film 9 is formed on the entire surface of the resultant structure, and a common contact hole 4 that reaches an inner protective diffusion layer 2 is formed in the insulating interlayer film 9, in the same manner as in the step shown in FIG. 3E. A p-type impurity is ion-implanted in a silicon substrate 1 by using the side-wall insulating film 18 and field oxide film 8 as the mask to form an internal diffusion layer 17 on the surface of the protective diffusion layer 2. A metal plug 10 fills the common contact hole 4, and the word line 3 and internal diffusion layer 17 are electrically connected to a first aluminum wiring layer 5.

This second embodiment is effective when positive and negative voltages are applied to the word line 3 by the operation of the flash memory.

In each embodiment described above, the present invention is applied to a flash memory. However, formation of the common contact hole 4 is not limited to the case of a flash memory. For example, the present invention can be similarly applied to formation of a common contact hole extending across a word line and a protective diffusion layer in a semiconductor device constituted by a MOS transistor. Furthermore, the present invention can also be applied to formation of a common contact hole extending across an isolated floating electrode and a protective diffusion layer.

As has been described above, according to the present invention, the protective diffusion layer is formed to be self-aligned with the electrode, and the adjacent protective diffusion layers are arranged in a direction perpendicularly intersecting the word lines to stagger with them. Therefore, the area occupied by the protective diffusion layers decreases, and the area of the semiconductor chip will not increase, unlike in the prior art.

The common contact hole is formed to extend across the electrode, e.g., a word line, and a protective diffusion layer, and the metal plug fills the common contact hole. Even if the metal plug is formed by deposition and dry etching, i.e., etch back, of a refractory metal, the charges of the word line from the plasma in the etch back step are removed through the protective diffusion layers, so that dielectric breakdown occurring in the prior art is completely eliminated.

As a result, even if the semiconductor elements constituting the semiconductor devices are micropatterned and arranged at a high density, high-density, high-yield semiconductor devices can be manufactured easily.

What is claimed is:

1. A method of manufacturing a semiconductor device, comprising the steps of;

selectively forming a first insulating film for element isolation on a semiconductor substrate having one conductivity type;

forming a floating gate electrode on a surface of a portion of said semiconductor substrate, where said first insulating film is not formed, through a first gate insulating film;

forming a word line of a memory cell on said floating gate electrode through a second gate insulating film;

forming an opening portion in said first insulating film to be self-aligned with an end portion of said word line, with such a depth to expose said surface of said semiconductor substrate;

forming a diffusion layer having an opposite conductivity type by introducing an impurity having the opposite conductivity type to a surface of a portion of said semiconductor substrate which is exposed through said opening portion;

forming a second insulating film on said diffusion layer, said word line, and said first insulating film;

forming a common contact hole in said second insulating film to extend across said end portion of said word line and said diffusion layer, said common contact hole being formed with such a depth to reach said diffusion layer while exposing said end portion of said word line; and filling said common contact hole with a metal plug which electrically connects said diffusion layer and said end portion of said word line.

2. A method according to claim 1, wherein said word line is a control gate electrode of a floating gate electrode formed on said surface of said portion of said semiconductor substrate where said first insulating film is not formed.

3. A method of manufacturing a semiconductor device, comprising the steps of;

selectively forming a first insulating film for element isolation on a semiconductor substrate having one conductivity type;

forming a floating gate electrode on a surface of a portion of said semiconductor substrate, where said first insulating film is not formed, through a first gate insulating film;

forming a word line of a memory cell on said floating gate electrode through a second gate insulating film;

forming an opening portion in said first insulating film to be self-aligned with an end portion of said word line, at a depth to expose said surface of said semiconductor substrate;

forming a first diffusion layer having an opposite conductivity type by doping an impurity having the opposite conductivity type in a surface of a portion of said semiconductor substrate which is exposed through said opening portion;

forming a second diffusion layer by implanting an impurity having one conductivity type in said surface of said first diffusion layer, said first and second diffusion layers constituting a double diffusion layer;

forming a second insulating film on said second diffusion layer, said word line, and said first insulating film;

forming a common contact hole in said second insulating film to extend across said end portion of said word line and said second diffusion layer, said common contact hole being formed at a depth to reach said second diffusion layer while exposing said end portion of said word line; and filling said common contact hole with a metal plug which electrically connects said second diffusion layer and said end portion of said word line.

4. A method according to claim 3, wherein said word line is a control gate electrode of a floating gate electrode formed on said surface of said portion of said semiconductor substrate where said first insulating film is not formed.

5. A method according to claim 3, wherein the step of forming said second diffusion layer comprises the steps of forming a third insulating film on a side wall of said first insulating film and said word line, and implanting an impurity having one conductivity type in a surface of said first diffusion layer by using said first and third insulating films as a mask.

\* \* \* \* \*